(12) United States Patent
Panteleev et al.

(10) Patent No.: US 7,380,223 B2
(45) Date of Patent: May 27, 2008

(54) METHOD AND SYSTEM FOR CONVERTING NETLIST OF INTEGRATED CIRCUIT BETWEEN LIBRARIES

(75) Inventors: Pavel Panteleev, Moscow (RU); Andrey A. Nikitin, Moscow (RU); Alexander E. Andreev, San Jose, CA (US)

(73) Assignee: LSI Corporation, Milpitas, CA (US)

( * ) Notice: Subject to any disclaimer, the term of this patent is extended or adjusted under 35 U.S.C. 154(b) by 233 days.

(21) Appl. No.: 11/257,206

(22) Filed: Oct. 24, 2005

(65) Prior Publication Data

US 2007/0094621 A1  Apr. 26, 2007

(51) Int. Cl.
*G06F 17/50* (2006.01)
(52) U.S. Cl. .............................................. 716/3; 716/2
(58) Field of Classification Search ................. 716/1, 716/3, 17, 18
See application file for complete search history.

(56) References Cited

U.S. PATENT DOCUMENTS

| 4,703,435 | A | * | 10/1987 | Darringer et al. | 716/18 |
| 5,257,201 | A | * | 10/1993 | Berman et al. | 716/2 |
| 5,311,442 | A | * | 5/1994 | Fukushima | 716/18 |
| 6,587,990 | B1 | * | 7/2003 | Andreev et al. | 716/2 |
| 6,848,094 | B2 | | 1/2005 | Andreev et al. | 716/12 |
| 7,082,587 | B2 | * | 7/2006 | Chen et al. | 716/6 |

* cited by examiner

*Primary Examiner*—Vuthe Siek
(74) *Attorney, Agent, or Firm*—Suiter Swantz PC LLO

(57) ABSTRACT

The present invention provides a method for converting a netlist of an integrated circuit from a first library to a second library. The first library may include logic cells AND, OR and NOT, and the second library may include logic cells NAND and NOR. The method includes steps as follows. Logic cells of the netlist are topologically sorted from outputs to inputs. AND and OR cells of the netlist are replaced with NOT, NAND and NOR cells. Simplification of the netlist is performed in a topological order.

20 Claims, 6 Drawing Sheets

```
Used variables:
  S, S' - sets of cells;
  w(g) - the integer, the weight of cell g
begin
  S:= the set of all output cells;
  for all cells g in N w(g):=0;
  while |S| > 0 do
    S' := ∅;
    for all cells g ∈ S do
      for all cells g' ∈ I(g) do
        w(g') := w(g') + 1;
        if w(g') = |O(g')| then S' := S' ∪ {g'};
      end for
      if |O_(g)| = |O(g)| then
        if g = AND(X,Y,Z) then
          delete g; add gate NAND(X,Y,Z);
        if g = OR(X,Y,Z) then
          delete g; add gate NOR(X,Y,Z);
        if g = NOT(X,Z) then eliminate g;
        for all invertors g'∈ O_(g) do eliminate g';
      else
        if g = AND(X,Y,Z) then
          delete g;
          add wire X', gates NOT(X,X'), NOT(Y,Y'),
              NOR(X',Y',Z);
        end if
        if g = OR(X,Y,Z) then
          delete g;
          add wire X', gates NOT(X,X'), NOT(Y,Y'),
              NAND(X',Y',Z);
        end if
      end if
    end for
    S := S';
  end while
end
```

*FIG. 2*

```
Used variables:
  S, S' - sets of cells;
  w(g) - the integer, the weight of cell g
begin
  S:= the set of all input cells;
  for all cells g in N do w(g) := 0;
  while |S| > 0 do
    S' := ∅;
    for all g ∈ S do
      for all g' ∈ O(g) do
        w(g') := w(g') + 1;
        if w(g') = |I(g')| then S' := S' ∪ {g'};
      end for
      if |O_(g)| > 0 then
        add wire NZ and cell g₀ = NOT(Z, NZ),
          where Z is output of g;
        connect NZ to all invertors in the set O_(g);
      end if
      for all g' ∈ O_(g) do eliminate g';
      if g = NOT(X, Z) then
        delete g₀, NZ;
        connect X to all pins that NZ was connected to;
      end if
      if g = G(X, Y, Z), where G ∈ {NAND, NOR} then
        if |I_(g)| = 2 then double_invertor_rule(g);
        if |I_(g)| = 1 then one_invertor_rule(g);
      end if
    end for
    S := S';
  end while
end
```

*FIG. 3*

```
if g = G(X', Y', Z), G ∈ {NAND, NOR} and
    there are cells g₁ = NOT(X, X'), g₂ = NOT(Y, Y') then
    delete g, g₁, g₂, X', Y';
    add cell G*(X, Y, NZ);
    if |O₊(g)| > 0 then   add NOT(NZ, Z);
end if
```

FIG. 4

```
M₀ := max{Arr(X)+2+Dep(Z),  Arr(X)+3+Dep(NZ),
    Arr(Y)+1+Dep(Z),   Arr(Y)+2+Dep(NZ)};
M₁ := max{Arr(X)+2+Dep(Z),  Arr(X)+1+Dep(NZ),
    Arr(Y)+3+Dep(Z),   Arr(Y)+2+Dep(NZ)};
if M₁ < M₀ then  // case "b"
    delete X';
    add wire Y', cell G*(X, Y', NZ);
    connect output of g₀ to Z, input of g to NZ;
else // case "a"
    delete g;
    add wire Y', cells NOT(Y, Y'), G*(X, Y', NZ);
end if
```

FIG. 6

METHOD AND SYSTEM FOR CONVERTING NETLIST OF INTEGRATED CIRCUIT BETWEEN LIBRARIES

FIELD OF THE INVENTION

The present invention generally relates to the field of integrated circuits, particularly to a method and system for converting a netlist of an integrated circuit from a first library to a second library.

BACKGROUND OF THE INVENTION

Platform-based IC (integrated circuit) design is a powerful concept for coping with the increased pressure on time-to-market, design and manufacturing costs encountered in the current IC market. A platform is a large-scale, high-complexity semiconductor device that includes one or more of the following elements: (1) memory; (2) a customizable array of transistors; (3) an IP (intellectual property) block; (4) a processor, e.g., an ESP (embedded standard product); (5) an embedded programmable logic block; and (6) interconnect. RapidChip™ developed by LSI Logic Corp. is an instance of a platform. The basic idea behind the platform-based design is to avoid designing and manufacturing a chip from scratch. Some portion of the chip's architecture is predefined for a specific type of application. Through extensive design reuse, the platform-based design may provide faster time-to-market and reduced design cost.

Under a platform approach, there are two distinct steps entailed in creating a final end-user product: a prefabrication step and a customization step. In a prefabrication step, a slice is built on a wafer. A slice is a pre-manufactured chip in which all silicon layers have been built, leaving the metal layers or top metal layers to be completed with the customer's unique IP. For example, RapidSlice™ developed by LSI Logic Corp. is an instance of a slice. One or more slices may be built on a single wafer. It is understood that a slice may include one or more bottom metal layers or may include no metal layers at all. In a preferred embodiment of the prefabrication step, portions of the metal layers are pre-specified to implement the pre-defined blocks of the platform and the diffusion processes are carried out in a wafer fab. The base characteristics, in terms of the IP, the processors, the memory, the interconnect, the programmable logic and the customizable transistor array, are all pre-placed in the design and pre-diffused in the slice. However, a slice is still fully decoupled because the customer has not yet introduced the function into the slice. In a customization step, the customer-designed function is merged with the pre-defined blocks and the metal layers (or late-metal components) are laid down, which couple the elements that make up the slice built in the wafer fab, and the customizable transistor array is configured and given its characteristic function. In other embodiments, early-metal steps may be part of the pre-fabricated slice to reduce the time and cost of the customization step, resulting in a platform which is more coupled and specific. It is understood that a prefabrication step and a customization step may be performed in different foundries. For example, a slice may be manufactured in one foundry. Later, in a customization step, the slice may be pulled from inventory and metalized, which gives the slice its final product characteristics in a different foundry.

A slice such as RapidSlicem™ may contain several RRAMs (Reconfigurable RAMs, or Redundant RAMs, or RapidSlice™ RAMs). Each RRAM is a set of memories of the same type that are placed compactly. RRAMs include built-in testing and self-repairing components and include a set of tools for mapping arbitrary customer memories (logical memories) to the memories from the matrix (physical memories). All RRAM memory ports are ports of customer memories. Ports of memories from the matrix are invisible from outside a RRAM. Thus, from the customer's point of view a RRAM is a set of customer memories.

A netlist describes the connectivity of an IC design. The problem of converting a netlist from one library to another often rises up during the development of chips based on the RapidChip™ technology, FPGA technology, and/or any other technology that deals with a restricted set of primitive cells. In particular, this problem arises when memory is mapped to RRAM. The memory need be converted to a tiling netlist which includes logic cells, flip-flops and some memories. The logic need be translated to the library {NAND, NOR} because only these cells are pre-diffused in RRAMs and thus can be used in the tiling netlist.

Assume a netlist which contains logic cells AND, OR and NOT only. In order to map the netlist to some technology that uses only the restricted set of primitive cells such as NAND and NOR cells, this netlist has to be converted from a first library {AND, OR, NOT} into a second library {NAND, NOR}. Conventionally, the following equalities may be used to solve the problem:

$$NOT(X)=NAND(X,X)$$

$$AND(X,Y)=NAND(NAND(X,Y), NAND(X,Y))$$

$$OR(X,Y)=NOR(NOR(X,Y), NOR(X,Y))$$

However, this method may greatly increase the depth and the number of cells of the netlist.

Thus, it is desirable to provide a method and system to address the foregoing described problems.

SUMMARY OF THE INVENTION

In an exemplary aspect, the present invention provides a method for converting a netlist of an integrated circuit from a first library to a second library. The first library may include logic cells AND, OR and NOT, and the second library may include logic cells NAND and NOR. The method includes steps as follows. Logic cells of the netlist are topologically sorted from outputs to inputs. AND and OR cells of the netlist are replaced with NOT, NAND and NOR cells. Simplification of the netlist is performed in a topological order.

In an additional exemplary aspect, the present invention provides a system for converting a netlist of an integrated circuit from a first library to a second library. The first library may include logic cells AND, OR and NOT, and the second library may include logic cells NAND and NOR. The system includes means for topologically sorting logic cells of the netlist from outputs to inputs, means for replacing AND and OR cells of the nethist with NOT, NAND and NOR cells, and means for performing simplification of the netlist in a topological order.

In another exemplary aspect, the present invention provides a computer-readable medium having computer-executable instructions for performing a method for converting a netlist of an integrated circuit from a first library to a second library. The first library may include logic cells AND, OR and NOT, and the second library may include logic cells NAND and NOR. The method includes steps as follows. Logic cells of the netlist are topologically sorted from outputs to inputs. AND and OR cells of the netlist are replaced with NOT, NAND and NOR cells. Simplification of the netlist is performed in a topological order.

It is to be understood that both the foregoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which:

FIG. 2 shows the pseudocode for topologically sorting logic cells of a netlist from outputs to inputs and for replacing AND and OR cells of the netlist with NOT, NAND and NOR cells in accordance with an exemplary embodiment of the present invention;

FIG. 3 shows the pseudocode for performing simplification of a netlist in a topological order in accordance with an exemplary embodiment of the present invention;

FIG. 4 shows the pseudocode for the double_invertor_rule in accordance with an exemplary embodiment of the present invention;

FIG. 6 shows the pseudocode for the one_invertor_rule in accordance with an exemplary embodiment of the present invention.

DETAILED DESCRIPTION OF THE INVENTION

Reference will now be made in detail to the presently preferred embodiments of the invention, examples of which are illustrated in the accompanying drawings.

The present invention discloses a method and system for converting a netlist of an integrated circuit from a first library to a second library. The present invention provides an algorithm which does not increase the depth of the netlist by more than a constant C and runs in time O(n), where n is the number of logic cells of the netlist.

Figure 1:
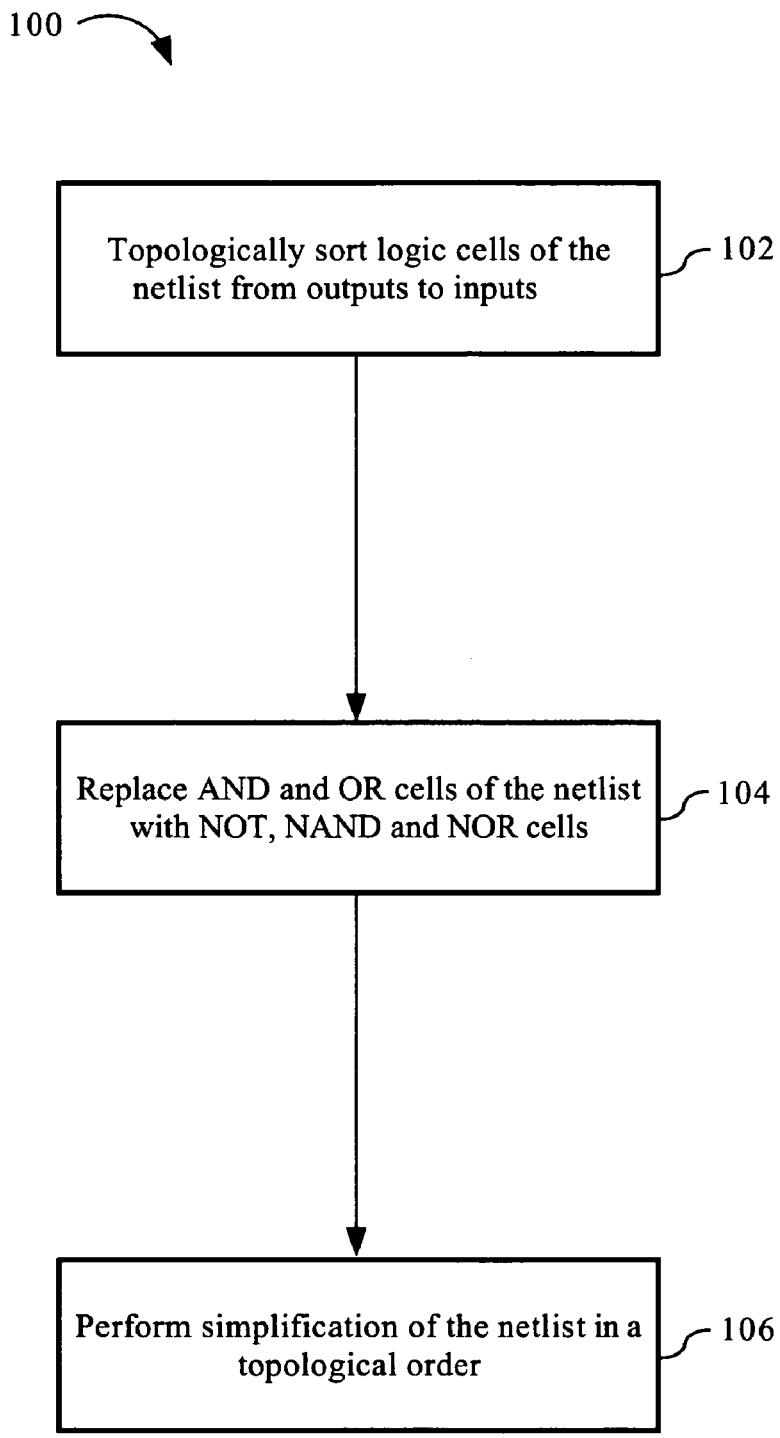
FIG. 1 is a flow diagram of a method for converting a netlist of an integrated circuit from a first library to a second library in accordance with an exemplary embodiment of the present invention.

Referring to FIG. 1, a method 100 for converting a netlist of an integrated circuit from a first library to a second library in accordance with an exemplary embodiment of the present invention is shown. The first library may include logic cells AND, OR and NOT. The second library may include logic cells NAND and NOR. For example, the second library may be a RRAM tiling netlist library, or the like. The method 100 includes steps as follows. Logic cells of the netlist are topologically sorted from outputs to inputs 102. AND and OR cells of the netlist are replaced with NOT, NAND and NOR cells 104. In a preferred embodiment, for AND and OR cells, the following two ways may be used to express them via NOT, NOR and NAND cells:

$$AND(X,Y)=NOT(NAND(X,Y)), OR(X,Y)=NOT(NOR(X,Y)) \quad 1)$$

$$AND(X,Y)=NOR(NOT(X), NOT(Y)), OR(X,Y)=NAND(NOT(X), NOT(Y)) \quad 2)$$

When selecting between these two ways, NOT cells are preferably pushed through the cells to be placed as close to inputs of the netlist as possible.

Let S be a set of some elements. Denote |S| as the number of elements in S. Consider a netlist N. Denote W(N) and G(N) as the set of wires and cells of N, respectively. The set W(G) includes two subsets IW(G)—input wires of N and OW(N)—output wires of N. Each cell g ∈ G(N) has some input and output pins. All the pins are numbered. Only cells with one output pin are considered. Each cell g has a type denoted by type(g), which defines the number of inputs and outputs and a Boolean function the cell implements. Each pin of cell g is connected to some wire w ∈ W(N). Based on the fact that cell g of type G has input wires $w_1, W_2, \ldots, w_k$ (the wire $w_i$ connected to the $i^{th}$ input pin of g) and output wire w (the wire connected to output pin of g), denote $g=G(w_1, W_2, \ldots, W_k, w)$. Simple path in the netlist N is a sequence $g_1, g_2, \ldots, g_1$ of cells such that each cell $g_{i+1}$ has an input wire w that is output for $g_i$. The depth of N denoted by D(N) is the length of the longest simple path from some input cell $g_0$ ($g_0$ connected to an input wire of N) to some output cell $g_1$ ($g_1$ connected to an output wire of N). Let Arr(w) (Dep(w)) be arrival (departure) for wire w, i.e., the length of the longest simple path that connects some input (output) cell with w. The complexity of N denoted by Com(N) is the number of cells in the netlist N. For any cell g in N, denote by I(g) and O(g) the cells connected to input and output wires of g, respectively. Let O_(g) be the set of all invertors in O(g) and O_+(g) be the rest of O(g). Let L(g) be the set of all invertors in I(g) and I_+(g) be the rest of I(g). Denote by type(g) the type of g. NAND is defined as dual to NOR and NOR is dual to NAND. If G ∈ {NAND, NOR} then denote by G* the dual for G. Suppose there are two wires $w_1$ and $w_2$. If $w_1$ is deleted and $w_2$ is connected to all the pins $w_1$ was connected, then we say that we assign w, to $w_2$. Consider a cell $g=NOT(w_1, w_2)$. We say that we eliminate g from the netlist N if we delete cell g and assign $w_1$ to $w_2$.

FIG. 2 shows the pseudocode for topologically sorting logic cells of a netlist from outputs to inputs (e.g., the step 102 shown in FIG. 1) and for replacing AND and OR cells of the netlist with NOT, NAND and NOR cells (e.g., the step 104 shown in FIG. 1) in accordance with an exemplary embodiment of the present invention.

Referring back to FIG. 1, simplification of the netlist is performed in a topological order 106. Preferably, this step is implemented starting from the inputs of the netlist. For example, NAND(NOT(X), NOT(Y)) may be simplified as NOT(NOR(X,Y)), NOR(NOT(X), NOT(Y)) as NOT(NAND(X,Y)), NOT(NOT(X)) as X, and the like. The simplification is performed so that the depth and the number of logic cells of the netlist are reduced as much as possible (but the depth comes first).

FIG. 3 shows the pseudocode for performing simplification of a netlist in a topological order (e.g., the step 106 shown in FIG. 1) in accordance with an exemplary embodiment of the present invention.

Figure 5A:
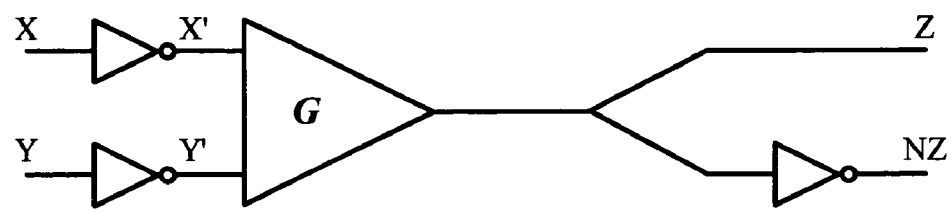
FIGS. 5A and 5B show the double_invertor_rule which changes the logic cells shown in FIG. 5A to those shown in FIG. 5B in accordance with an exemplary embodiment of the present invention.
Figure 5B:
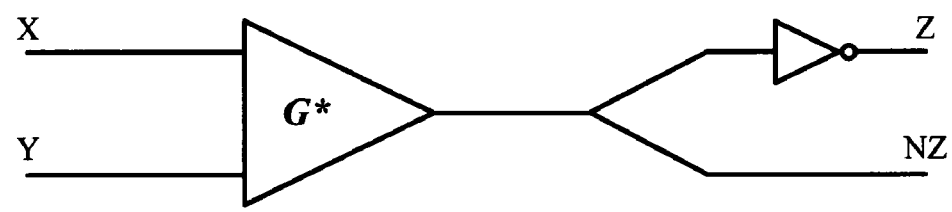

As shown in FIG. 3, a simplification rule double_invertor_rule may be used. The pseudocode for the double_invertor_rule in accordance with an exemplary embodiment of the present invention is shown in FIG. 4. FIGS. 5A and 5B show the double_invertor_rule which changes the logic cells shown in FIG. 5A to those shown in FIG. 5B in accordance with an exemplary embodiment of the present invention. As shown, this simplification rule double_invertor_rule does not change the depth of the net but decrease its complexity.

Figure 7A:
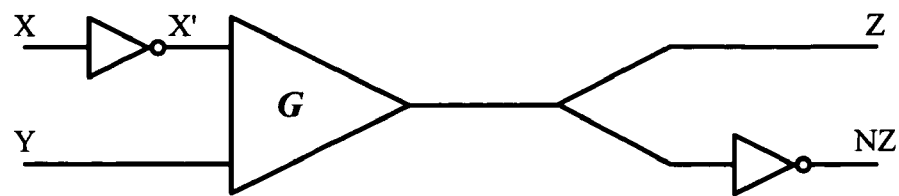
FIGS. 7A, 7B and 7C show the one_invertor_rule which changes the logic cells shown in FIG. 7A to those shown in FIG. 7B (case "a") and changes the logic cells shown in FIG. 7A to those shown in FIG. 7C (case "b") in accordance with an exemplary embodiment of the present invention.
Figure 7B:
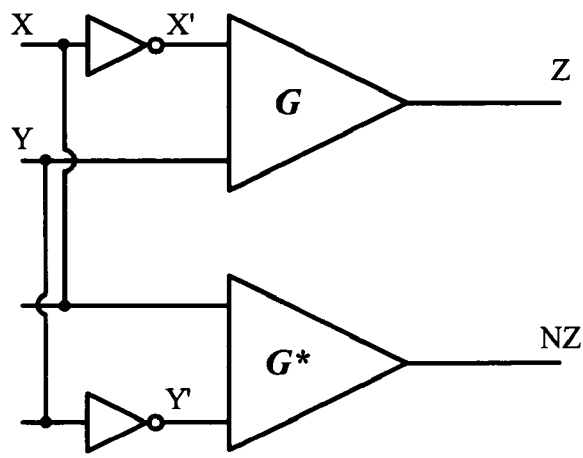
Figure 7C:
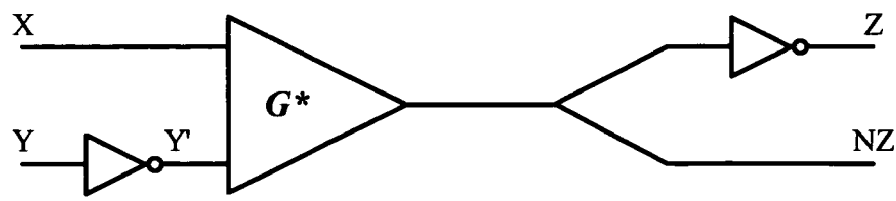

As shown in FIG. 3, another simplification rule one_invertor_rule may also be used. However, unlike the rule double_invertor_rule, the rule one_invertor_rule cannot be applied without increasing the depth or complexity in all cases. Thus, the rule one_invertor_rule is preferably applied only if it does not increase the depth of the netlist N. Note that it may increase complexity of the netlist N. FIG. 6 shows the pseudocode for the one_invertor_rule in accordance with an exemplary embodiment of the present invention. FIGS. 7A, 7B and 7C show the one_invertor_rule which changes the logic cells shown in FIG. 7A to those shown in FIG. 7B (case "a") and changes the logic cells shown in FIG. 7A to those shown in FIG. 7C (case "b") in accordance with an exemplary embodiment of the present invention. In case "a" (see FIG. 7B), if there is an inverted output from the cell whose output wire is Y, then this output may be used instead of adding NOT cell (in this case the complexity of the netlist N is not increased).

It is to be noted that the foregoing described embodiments according to the present invention may be conveniently implemented using conventional general purpose digital computers programmed according to the teachings of the present specification, as will be apparent to those skilled in the computer art. Appropriate software coding may readily be prepared by skilled programmers based on the teachings of the present disclosure, as will be apparent to those skilled in the software art.

It is to be understood that the present invention may be conveniently implemented in forms of a software package. Such a software package may be a computer program product which employs a computer-readable storage medium including stored computer code which is used to program a computer to perform the disclosed function and process of the present invention. The computer-readable medium may include, but is not limited to, any type of conventional floppy disk, optical disk, CD-ROM, magneto-optical disk, ROM, RAM, EPROM, EEPROM, magnetic or optical card, or any other suitable media for storing electronic instructions.

It is understood that the specific order or hierarchy of steps in the processes disclosed is an example of exemplary approaches. Based upon design preferences, it is understood that the specific order or hierarchy of steps in the processes may be rearranged while remaining within the scope of the present invention. The accompanying method claims present elements of the various steps in a sample order, and are not meant to be limited to the specific order or hierarchy presented.

It is believed that the present invention and many of its attendant advantages will be understood by the foregoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. A method for converting a netlist of an integrated circuit from a first library to a second library, said first library including logic cells AND, OR and NOT, said second library including logic cells NAND and NOR, said method comprising steps of:
topologically sorting logic cells of said netlist from outputs to inputs;
replacing AND and OR cells of said netlist with NOT, NAND and NOR cells;
performing simplification of said netlist in a topological order; and
providing an algorithm which increases depth of the netlist by no more than a constant C and which runs in time O(n), n being equal to a total number of logic cells of the netlist.

2. The method of claim 1, wherein in said replacing step said AND cells of said netlist are replaced as AND(X,Y)= NOT(NAND(X,Y)), and said OR cells of said netlist are replaced as OR(X,Y)=NOT(NOR(X,Y)).

3. The method of claim 1, wherein in said replacing step said AND cells of said netlist are replaced as AND(X,Y)= NOR(NOT(X), NOT(Y)), and said OR cells of said netlist are replaced as OR(X,Y)=NAND(NOT(X), NOT(Y)).

4. The method of claim 3, wherein in said performing step NAND(NOT(X), NOT(Y)) is simplified as NOT(NOR(X, Y)), NOR(NOT(X), NOT(Y)) is simplified as NOT(NAND (X,Y)), and NOT(NOT(X)) is simplified as X.

5. The method of claim 1, wherein said replacing step is implemented so that NOT cells of said netlist are placed as close to said inputs of said netlist as possible.

6. The method of claim 1, wherein said performing step is implemented starting from said inputs of said netlist.

7. The method of claim 1, wherein said performing step is implemented so that a depth and a number of said logic cells of said netlist are reduced as much as possible.

8. The method of claim 1, wherein said performing step comprises utilizing double_invertor_rule to decrease complexity of said netlist.

9. The method of claim 1, wherein said performing step comprises utilizing one_invertor_rule when said one_invertor_rule does not increase a depth of said netlist.

10. The method of claim 1, wherein said second library is a RRAM tiling netlist library.

11. A computer-readable medium having computer-executable instructions for performing a method for converting a netlist of an integrated circuit from a first library to a second library, said first library including logic cells AND, OR and NOT, said second library including logic cells NAND and NOR, said method comprising steps of:
topologically sorting logic cells of said netlist from outputs to inputs;
replacing AND and OR cells of said netlist with NOT, NAND and NOR cells;
performing simplification of said netlist in a topological order; and
providing an algorithm which increases depth of the netlist by no more than a constant C and which runs in time O(n), n being equal to a total number of logic cells of the netlist.

12. The computer-readable medium of claim 11, wherein in said replacing step said AND cells of said netlist are replaced as AND(X,Y)=NOT(NAND(X,Y)), and said OR cells of said netlist are replaced as OR(X,Y)=NOT(NOR(X, Y)).

13. The computer-readable medium of claim 11, wherein in said replacing step said AND cells of said netlist are replaced as AND(X,Y)=NOR(NOT(X), NOT(Y)), and said OR cells of said netlist are replaced as OR(X,Y)=NAND (NOT(X), NOT(Y)).

14. The computer-readable medium of claim 13, wherein in said performing step NAND(NOT(X), NOT(Y)) is simplified as NOT(NOR(X,Y)), NOR(NOT(X), NOT(Y)) is simplified as NOT(NAND(X,Y)), and NOT(NOT(X)) is simplified as X.

15. The computer-readable medium of claim 11, wherein said replacing step is implemented so that NOT cells of said netlist are placed as close to said inputs of said netlist as possible.

16. The computer-readable medium of claim 11, wherein said performing step is implemented starting from said inputs of said netlist.

17. The computer-readable medium of claim 11, wherein said performing step comprises utilizing double_invertor_rule to decrease complexity of said netlist.

18. The computer-readable medium of claim 11 wherein said performing step comprises utilizing one_invertor_rule when said one_invertor_rule does not increase a depth of said netlist.

19. The computer-readable medium of claim 11, wherein said second library is a RRAM tiling netlist library.

20. A system for converting a netlist of an integrated circuit from a first library to a second library, said first library including logic cells AND, OR and NOT, said second library including logic cells NAND and NOR, said system comprising:

means for topologically sorting logic cells of said netlist from outputs to inputs;

means for replacing AND and OR cells of said netlist with NOT, NAND and NOR cells;

means for performing simplification of said netlist in a topological order; and means for providing an algorithm which increases depth of the netlist by no more than a constant C and which runs in time O(n), n being equal to a total number of logic cells of the netlist.

* * * * *